US012648480B2

(12) United States Patent
Vincent et al.

(10) Patent No.: US 12,648,480 B2
(45) Date of Patent: Jun. 2, 2026

(54) PACKAGE WITH MOLD-EMBEDDED INDUCTOR AND METHOD OF FABRICATION THEREFOR

(71) Applicant: NXP USA, Inc., Austin, TX (US)

(72) Inventors: Michael B. Vincent, Chandler, AZ (US); Varughese Mathew, Austin, TX (US)

(73) Assignee: NXP USA, Inc., Austin, TX (US)

( * ) Notice: Subject to any disclaimer, the term of this patent is extended or adjusted under 35 U.S.C. 154(b) by 913 days.

(21) Appl. No.: 17/818,728

(22) Filed: Aug. 10, 2022

(65) Prior Publication Data

US 2024/0055415 A1 Feb. 15, 2024

(51) Int. Cl.
*H10W 90/00* (2026.01)
*H01F 27/28* (2006.01)
(Continued)

(52) U.S. Cl.
CPC ........ *H10W 90/00* (2026.01); *H01F 27/2804* (2013.01); *H01F 41/043* (2013.01);
(Continued)

(58) Field of Classification Search
CPC ......... H01L 25/16; H01L 21/56; H01L 23/52; H10D 1/20; H01F 27/2804; H01F 41/043; H01F 41/127
(Continued)

(56) References Cited

U.S. PATENT DOCUMENTS 1,202,770 A * 10/1916 Aycock ..................... E04D 3/38
                                                    52/541
8,558,344 B2 * 10/2013 Chen ....................... H01L 23/50
                                                    257/E29.325
(Continued)

FOREIGN PATENT DOCUMENTS

DE    10 2021 112577 A1    11/2022
WO    WO-2022/074983 A1    4/2022

OTHER PUBLICATIONS

LPKF Laser & Electronics; "Three-Dimensional Circuits LPKF LDS: Laser Direct Structuring for 3D Molded Interconnect Devices"; retrieved from the Internet brochure_lpkf_laser_direct_structuring_en.pdf ; 16 pages (Aug. 4, 2022).
(Continued)

*Primary Examiner* — Ori Nadav

(57) ABSTRACT

A semiconductor device package may include a package substrate, mold material formed over the package substrate, and a mold-embedded inductor that is embedded in the mold material. The mold-embedded inductor may be coupled to a die, such as a power management integrated circuit die, which may also be embedded in the mold material. The mold-embedded inductor may be formed by forming conductive traces and an inductor core in the mold material. For example, an active mold packaging (AMP) process and corresponding laser direct structuring (LDS) processes may be performed to form openings in the mold material and to activate surfaces of the mold material to facilitate subse-
(Continued)

quent plating of conductive material. Activated surfaces of the mold material may have micro-rough texture and may include bulk conductive material formed via the application of laser energy to additives in the mold material during the LDS process(es).

6 Claims, 20 Drawing Sheets

(51) Int. Cl.

| | |
|---|---|
| *H01F 41/04* | (2006.01) |
| *H01F 41/12* | (2006.01) |
| *H10D 1/20* | (2025.01) |
| *H10W 72/00* | (2026.01) |
| *H10W 74/01* | (2026.01) |
| *H10W 72/50* | (2026.01) |
| *H10W 74/10* | (2026.01) |

(52) U.S. Cl.
CPC ............. *H01F 41/127* (2013.01); *H10D 1/20* (2025.01); *H10W 72/00* (2026.01); *H10W 74/01* (2026.01); *H01F 2027/2814* (2013.01); *H10W 72/5445* (2026.01); *H10W 74/117* (2026.01); *H10W 90/754* (2026.01)

(58) Field of Classification Search
USPC ......................................................... 438/667
See application file for complete search history.

(56) References Cited

U.S. PATENT DOCUMENTS

| | | | |
|---|---|---|---|
| 10,249,580 | B2 | 4/2019 | Kim et al. |
| 10,763,164 | B2 | 9/2020 | Chen et al. |
| 10,943,725 | B2 | 3/2021 | Chatani et al. |
| 11,174,402 | B2 | 11/2021 | Meura |
| 2007/0126300 | A1* | 6/2007 | Greywall ............. H02K 19/103 |
| | | | 310/90 |
| 2014/0111273 | A1 | 4/2014 | Jou et al. |
| 2017/0018349 | A1 | 1/2017 | Otsubo et al. |
| 2017/0062113 | A1 | 3/2017 | Otsubo et al. |
| 2017/0367182 | A1 | 12/2017 | Wu et al. |
| 2018/0040420 | A1 | 2/2018 | Poddar |
| 2020/0066634 | A1 | 2/2020 | Do et al. |
| 2021/0249366 | A1 | 8/2021 | Hsu et al. |
| 2021/0305203 | A1 | 9/2021 | Graziosi et al. |
| 2022/0375883 | A1 | 11/2022 | Chua et al. |
| 2023/0360838 | A1 | 11/2023 | Miyazaki et al. |

OTHER PUBLICATIONS

Ahn CH et al: "A Fully Integrated Planar Toroidal Inductor With a Micromachined Nickel-Iron Magnetic Bar", IEEE Transactions on Components, Packaging andManufacturing Technology: Part A, 17. Sep. 1994, (pp. 463-469), vol. 17, No. 3, IEEE Service Center, Piscataway, NJ, US.

* cited by examiner

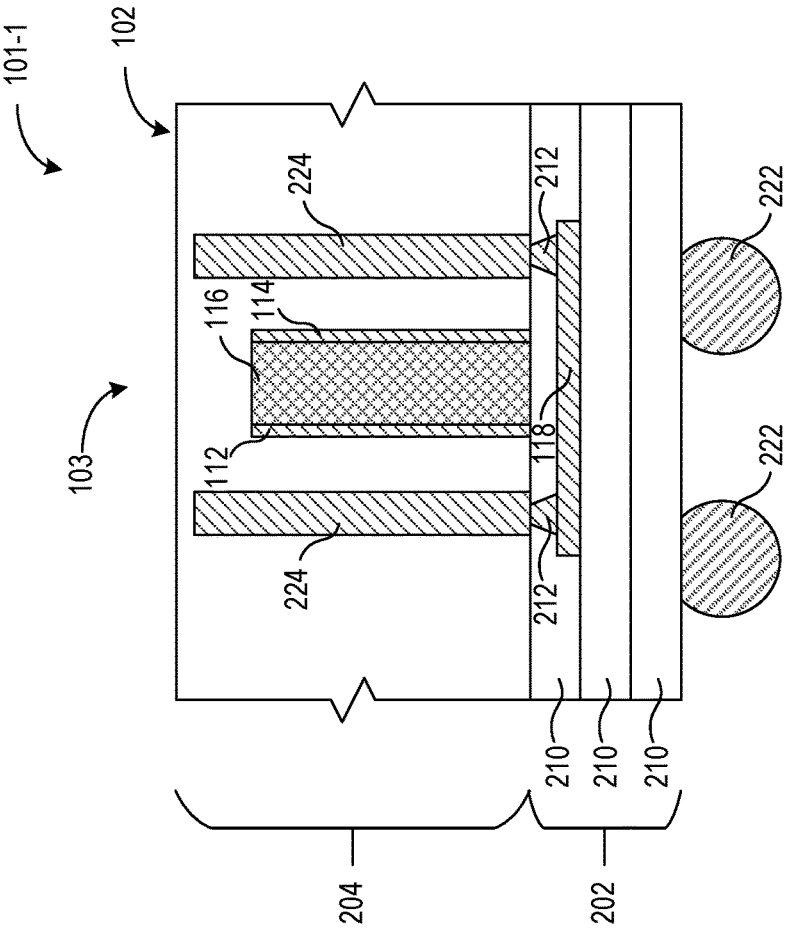
FIG. 3A

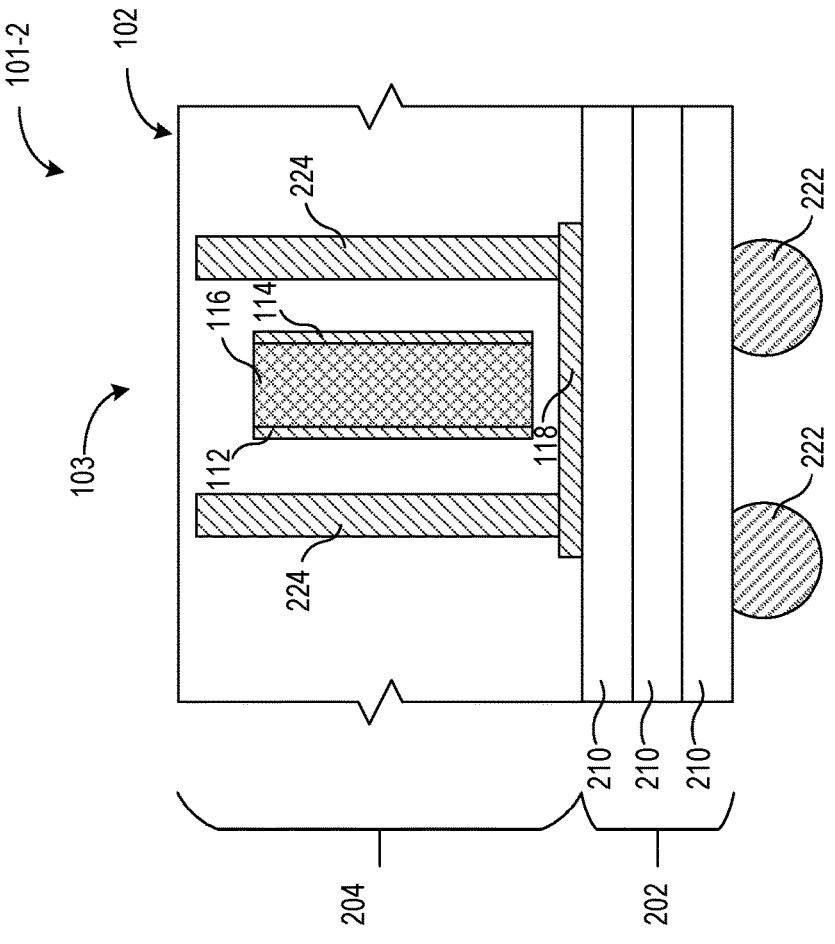
FIG. 3B

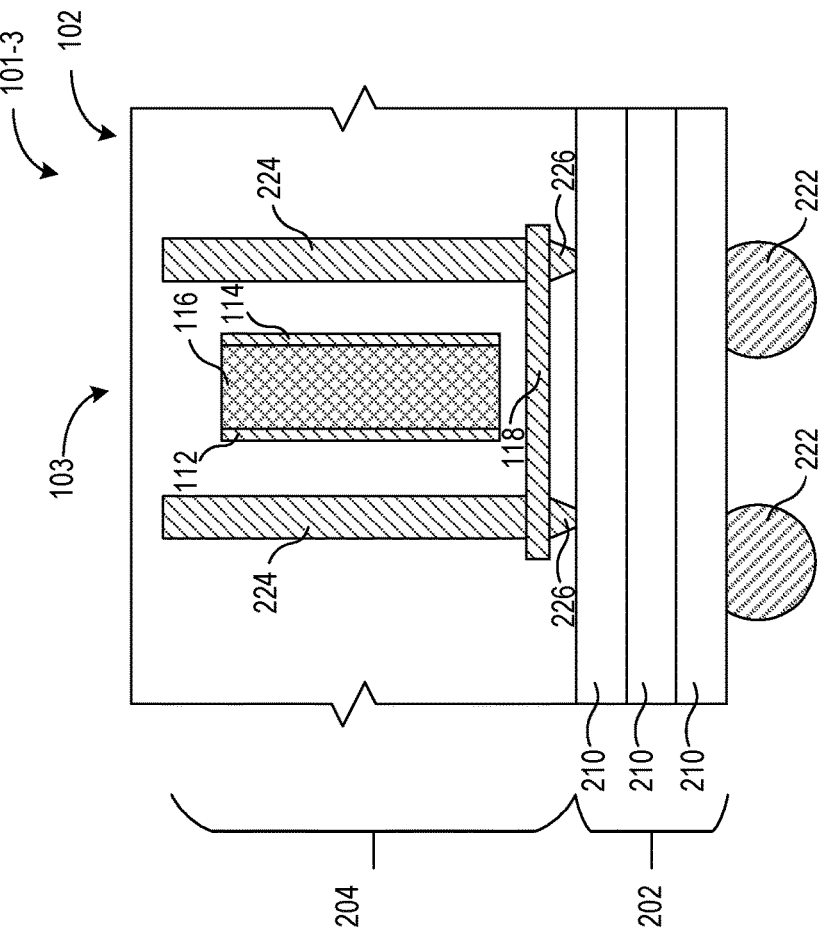
FIG. 3C

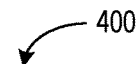

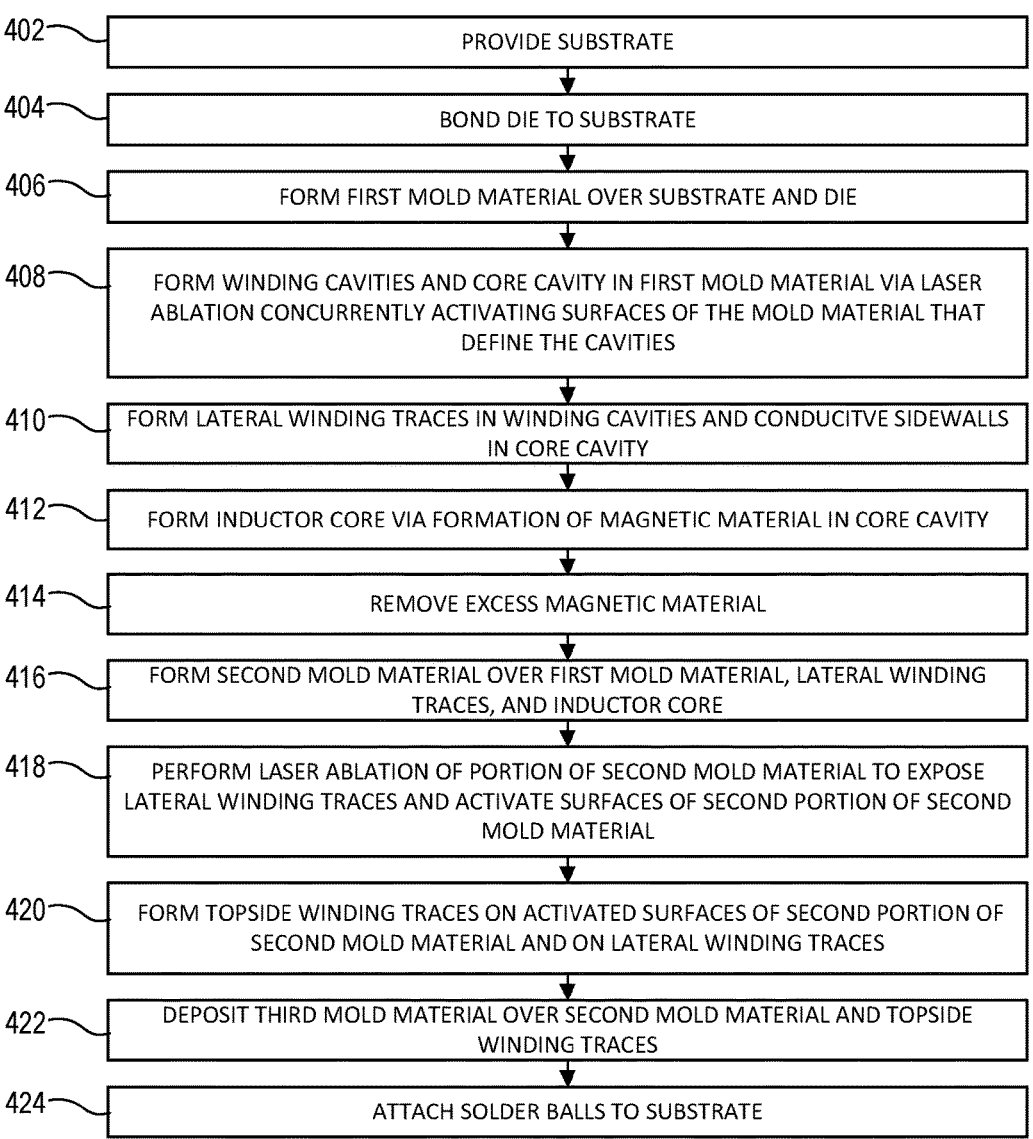

402 — PROVIDE SUBSTRATE

404 — BOND DIE TO SUBSTRATE

406 — FORM FIRST MOLD MATERIAL OVER SUBSTRATE AND DIE

408 — FORM WINDING CAVITIES AND CORE CAVITY IN FIRST MOLD MATERIAL VIA LASER ABLATION CONCURRENTLY ACTIVATING SURFACES OF THE MOLD MATERIAL THAT DEFINE THE CAVITIES

410 — FORM LATERAL WINDING TRACES IN WINDING CAVITIES AND CONDUCITVE SIDEWALLS IN CORE CAVITY

412 — FORM INDUCTOR CORE VIA FORMATION OF MAGNETIC MATERIAL IN CORE CAVITY

414 — REMOVE EXCESS MAGNETIC MATERIAL

416 — FORM SECOND MOLD MATERIAL OVER FIRST MOLD MATERIAL, LATERAL WINDING TRACES, AND INDUCTOR CORE

418 — PERFORM LASER ABLATION OF PORTION OF SECOND MOLD MATERIAL TO EXPOSE LATERAL WINDING TRACES AND ACTIVATE SURFACES OF SECOND PORTION OF SECOND MOLD MATERIAL

420 — FORM TOPSIDE WINDING TRACES ON ACTIVATED SURFACES OF SECOND PORTION OF SECOND MOLD MATERIAL AND ON LATERAL WINDING TRACES

422 — DEPOSIT THIRD MOLD MATERIAL OVER SECOND MOLD MATERIAL AND TOPSIDE WINDING TRACES

424 — ATTACH SOLDER BALLS TO SUBSTRATE

FIG. 4

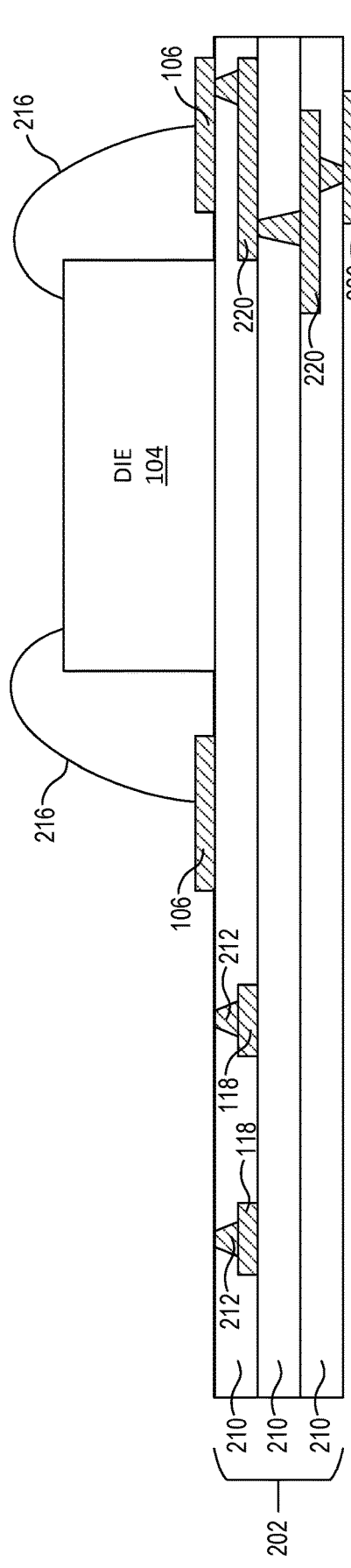
FIG. 6

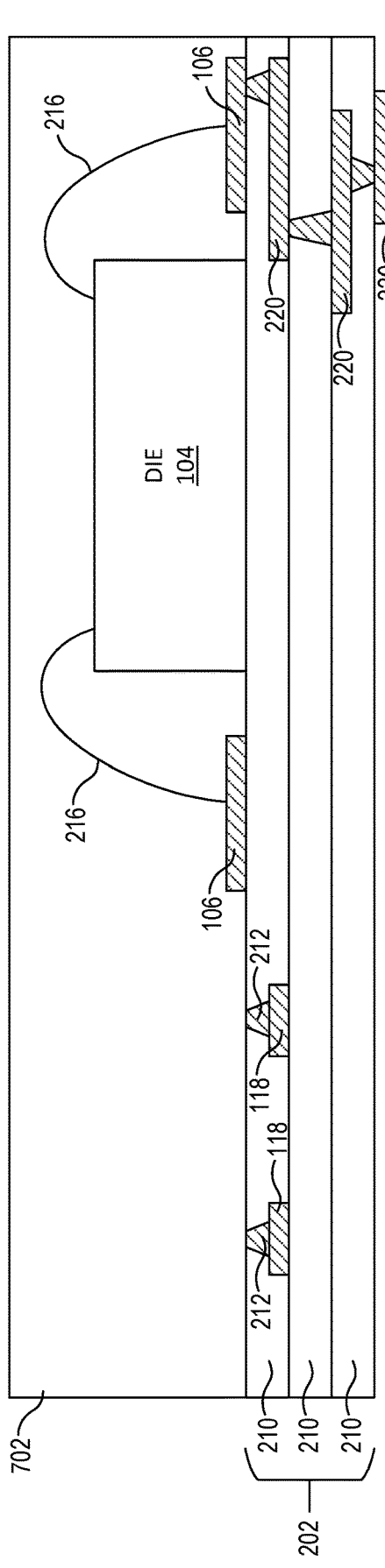
FIG. 7

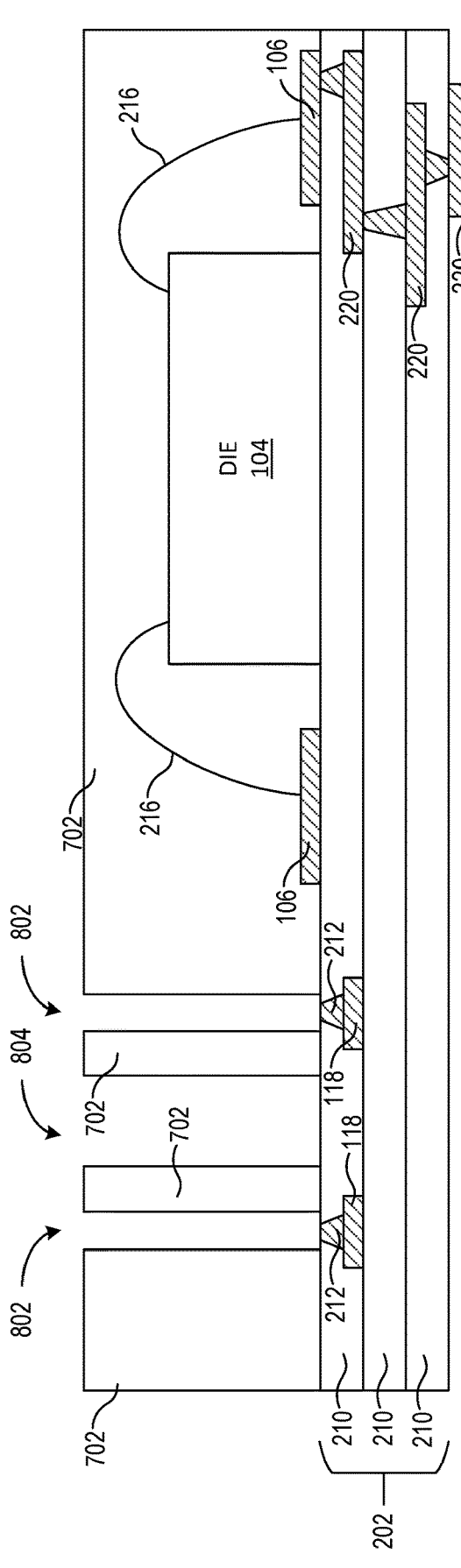
FIG. 8

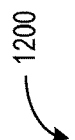
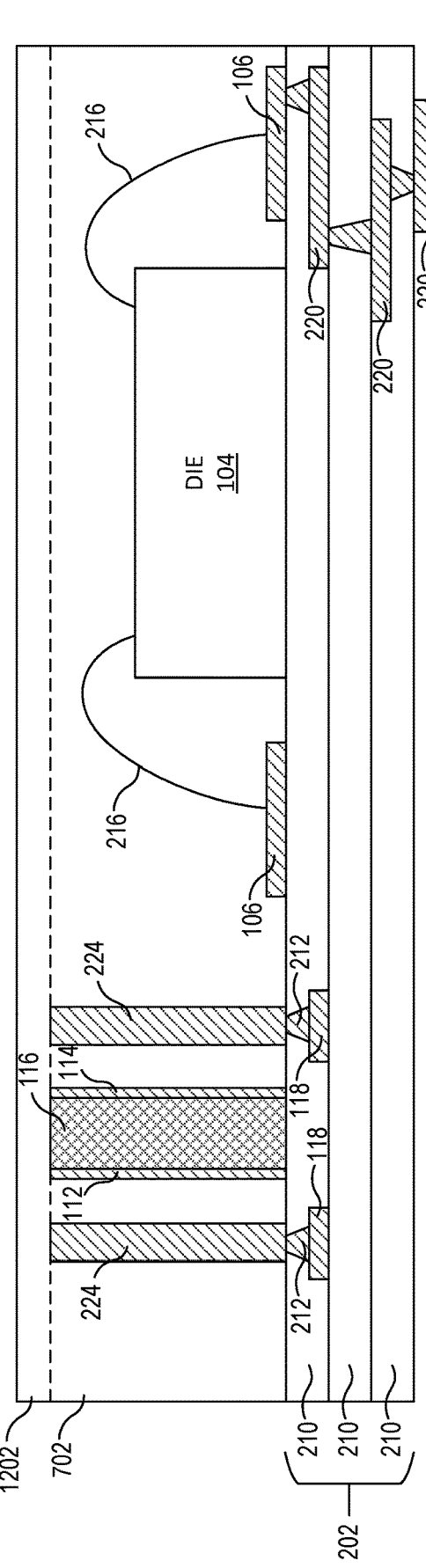
FIG. 12

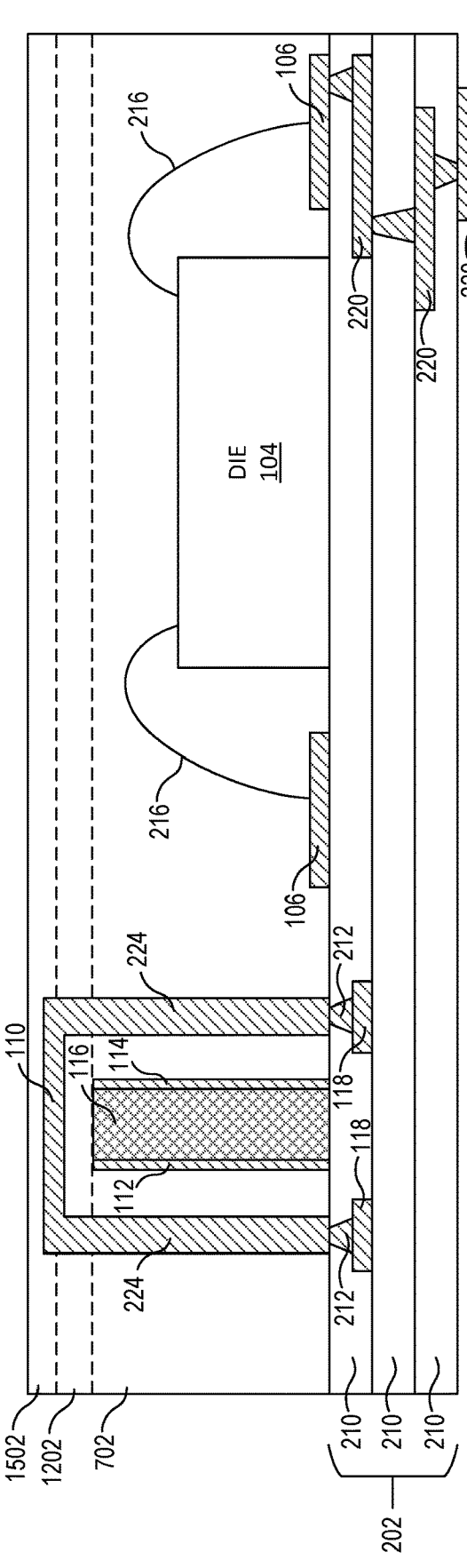
FIG. 15

PACKAGE WITH MOLD-EMBEDDED INDUCTOR AND METHOD OF FABRICATION THEREFOR

TECHNICAL FIELD

Embodiments of the subject matter described herein relate generally to semiconductor device packaging and, more specifically, to semiconductor device packaging having one or more mold-embedded inductors.

BACKGROUND

As the size of electronic components becomes smaller, and as the size of devices containing those electronic components also decreases, density demands for electronic chip packaging become greater. For example, power management systems for Ultra Low Power (ULP) Internet-of-Things (IoT) and High-End Computing (HEC) applications typically require voltage converters that include passive devices such as inductors and capacitors. However, the conventional discrete surface mount inductors tend to be undesirably large. That is, when attempting to design or produce a device package for such a power management system, conventionally, the size of the discrete surface mount inductors used may undesirably constrain the minimum achievable form factor of the device package in one or more dimensions.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, a semiconductor device package may include a package substrate, mold material formed over the package substrate, and an inductor embedded in the mold material. The inductor may include an inductor core disposed over the package substrate and embedded in the mold material and an inductor winding that includes multiple winding traces disposed around the inductor core. At least a portion of the multiple winding traces may be embedded in the mold material. The inductor core may include magnetic material.

In one or more embodiments, a long axis of the inductor core may be aligned parallel with respect to a top surface of the package substrate.

In one or more embodiments, the semiconductor device package may include an integrated circuit die disposed on the package substrate. The integrated circuit die may be coupled to the inductor.

In one or more embodiments, the integrated circuit die may be a power management integrated circuit die.

In one or more embodiments, the multiple winding traces may include lateral winding traces embedded in the mold material, topside winding traces at least partially embedded in the mold material, and bottom winding traces disposed in the package substrate.

In one or more embodiments, the topside winding traces may be only partially embedded in the mold material.

In one or more embodiments, the topside winding traces are completely embedded in the mold material.

In one or more embodiments, the inductor core may include a core cavity formed in the mold material. The inductor core may be disposed in the core cavity and conductive sidewalls formed in the core cavity. The inductor core may be interposed between the conductive sidewalls.

In an example embodiment, a method of forming a semiconductor device package may include steps of providing a package substrate, forming first mold material over the package substrate, and forming an inductor having an inductor core that is embedded in the first mold material and having an inductor winding that is at least partially embedded in the first mold material.

In one or more embodiments, the step of forming the inductor may include steps of forming winding cavities and a core cavity in the first mold material, forming lateral winding traces in the winding cavities, the inductor winding including the lateral winding traces, and forming the inductor core in the core cavity.

In one or more embodiments, the method may include steps of forming conductive sidewalls in the core cavity. The step of forming the inductor core in the core cavity may include forming magnetic material on the conductive sidewalls via electroless plating.

In one or more embodiments, the step of forming the winding cavities and the core cavity in the first mold material may include forming the winding cavities and the core cavity in the first mold material via laser ablation.

In one or more embodiments, the method may include a step of, while forming the winding cavities and the core cavity in the first mold material, activating first surfaces of the first mold material to form bulk conductive material via the laser ablation. The first mold material may include at least one laser-activatable additive configured to form the bulk conductive material in response to the laser ablation.

In one or more embodiments, forming the lateral winding traces in the winding cavities and forming the conductive sidewalls in the core cavity may be performed concurrently via electroless plating of the first surfaces of the first mold material activated via the laser ablation.

In one or more embodiments, the method may include steps of forming second mold material over the first mold material, the lateral winding traces, and the inductor core and performing additional laser ablation of the second mold material to form cavities in the second mold material that expose the lateral winding traces and form bulk conductive material in second surfaces of the second mold material via activation of at least one additional laser-activatable additive in the second mold material.

In one or more embodiments, the method may include a step of forming topside winding traces via electroless plating of conductive material on the second surfaces of the second mold material. The inductor winding may include the topside winding traces, and the topside winding traces may be formed at least partially in the cavities in the second mold material and at least partially overlapping the inductor core.

In one or more embodiments, the method may include a step of forming third mold material over the second mold material and over the topside winding traces.

In one or more embodiments, the laser ablation of the first surfaces of the first mold material and the additional laser ablation of the second surfaces of the second mold material respectively cause the first surfaces and the second surfaces to be micro-rough surfaces.

In one or more embodiments, the method may include a step of attaching solder balls to a bottom surface of the package substrate, opposite a top surface of the package substrate at which the inductor is formed.

In one or more embodiments, the method may include a step of, before forming the first mold material over the package substrate, bonding an integrated circuit die to the package substrate. The integrated circuit die may be electrically coupled to bottom winding traces of the inductor.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 3A-3C are respective cross-sectional views of embodiments the semiconductor device package of FIG. 1 along line B-B, each illustrating different arrangements of the bottom winding traces of the mold-embedded inductor, in accordance with various embodiments.

FIG. 4 is a process flow diagram describing a method for fabricating the semiconductor device package of FIGS. 1, 2A, and 3A, in accordance with various embodiments.

FIGS. 5-16 are cross sectional views depicting the semiconductor device package of FIG. 1 along line A-A at various stages of fabrication corresponding to, for example, the method of FIG. 4, in accordance with various embodiments.

DETAILED DESCRIPTION

Figure 1:
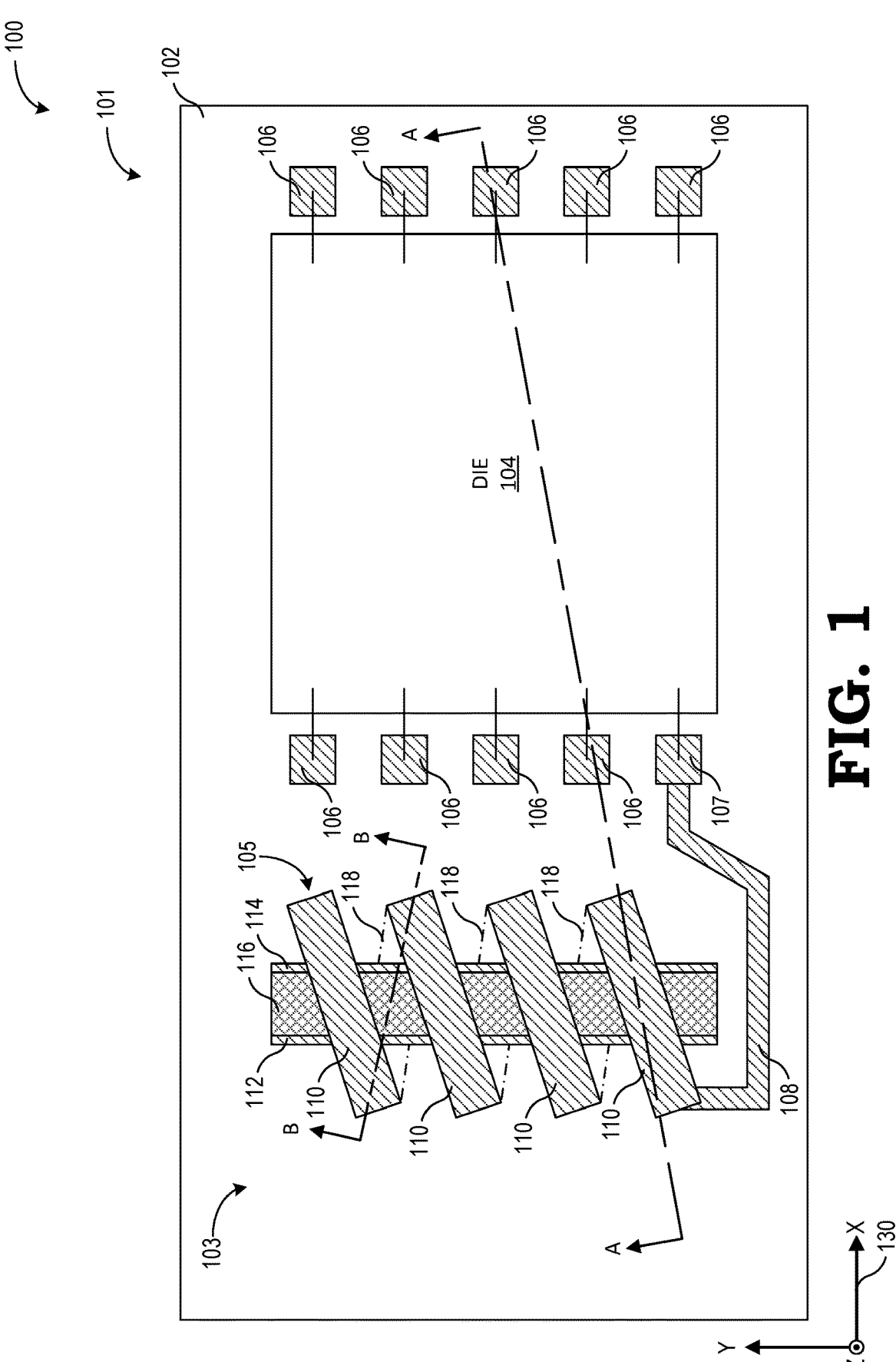
FIG. 1 is a top-down view of a semiconductor device package that includes a mold-embedded inductor, in accordance with various embodiments.

Various embodiments described herein address the above challenges by providing a device package, such as a semiconductor device package, and an associated fabrication method in which an inductor is formed in mold material disposed over the package substrate. As discussed above, power management systems, such as those used in ULP IoT and HEC applications typically require voltage converters that conventionally include large discrete surface mount inductors and capacitors. Such surface mount inductors may be undesirably larger than other components in the system. For example, surface mount inductors conventionally used in voltage converters for power management systems may be larger, with respect to the z-dimension (i.e., the dimension normal to the surface of the package substrate) than other components of the system, such as the power management integrated circuit (PMIC) die. Using discrete surface mount inductors to implement such voltage converters may undesirably increase the size (thickness) of the device package.

In one or more embodiments, an inductor may be integrated directly into mold material of a device package that covers the package substrate. An inductor core of the inductor may be formed in an opening in the mold material, and conductive winding traces (sometimes referred to herein as "conductive windings" or "winding traces") that form an inductor winding of the inductor may be formed around the inductor core in openings in the mold material and in the package substrate. The inductor winding of the inductor may be coupled to one or more device die (e.g., a PMIC die)

disposed on the package substrate and at least partially encapsulated by the mold material.

In one or more embodiments, one or more elements of the inductor may be formed using active mold packaging (AMP), laser direct structuring (LDS), and electrolytic or electroless plating processes. For example, magnetic core material (e.g., copper nickel iron (CoNiFe) or another suitable magnetic material) and at least a portion of the conductive winding traces (e.g., copper or another suitable material) included in the inductor winding may be formed in-situ after formation of mold material over the package substrate. An AMP process may use an LDS process to form cavities (i.e., openings) in mold material of a device package while concurrently activating surfaces of the mold material (e.g., for subsequent electroless plating of the activated surfaces). Surfaces of the mold material that are activated by the LDS process may catalyze subsequent electroless plating of one or more conductive materials. The mold material may include one or more additives (e.g., 3 valent copper or bivalent copper $Cu^{2+}$ as non-limiting examples) that are initially not electrically conductive but that become electrically conductive (e.g., via conversion of 3 valent copper to bulk copper) during laser ablation of the mold material. For example, after activating surfaces of the mold material using the LDS process, electroless copper plating may be performed to form copper on the activated surfaces of the mold material without forming copper on non-activated surfaces of the mold material.

In one or more embodiments, first mold material may be formed over the package substrate of a semiconductor device package. Laser ablation of first mold material may be performed to form winding cavities and a core cavity in the first mold material while concurrently activating surfaces of the mold material that define the winding cavities and the core cavity. Electroless plating of conductive material, such as copper, may be performed to form lateral winding traces in the winding cavities and conductive sidewalls on surfaces of the core cavity. An inductor core may then be formed by plating (e.g., electroless plating) the conductive sidewalls with magnetic material (e.g., CoNiFe or another suitable magnetic material). Second mold material may then be formed over the inductor core and the lateral winding traces. In this way, the inductor core and the lateral winding traces may be embedded in the first and second mold material. Laser ablation of portions of the second mold material may form cavities over the lateral winding traces while concurrently activating surfaces of the second mold material that define the cavities and overlap the inductor core. Topside winding traces may then be formed via electroless plating of conductive material (e.g., copper or another suitable conductive material) on the activated surfaces of the second mold material. Optionally, third mold material may be formed over the topside winding traces, such that the topside winding traces are embedded in the third mold material. In one or more embodiments, bottom winding traces (opposite the topside winding traces) may be disposed in the package substrate of the device package prior to formation of the first mold material.

Figure 2A:
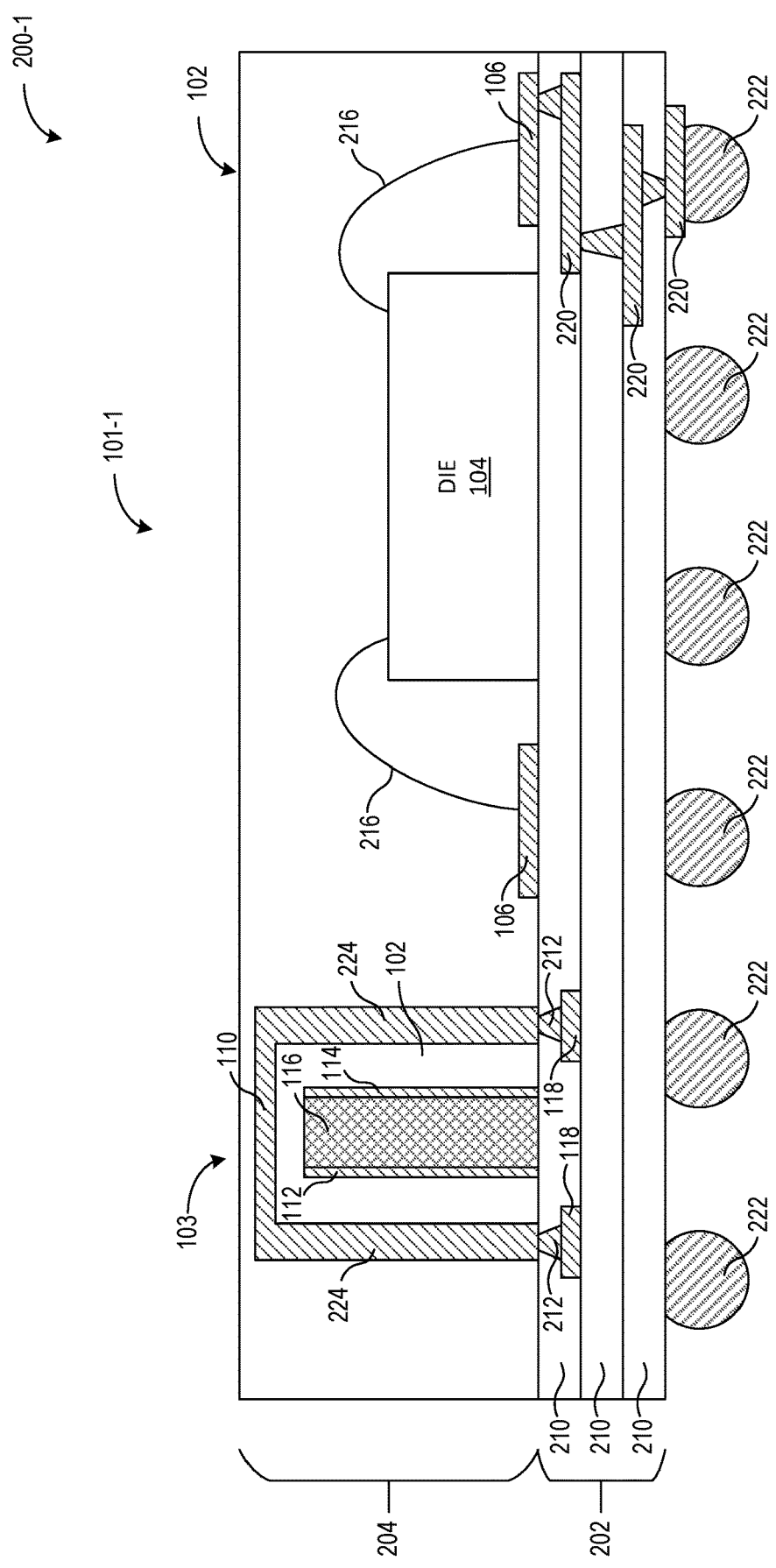
FIGS. 2A-2C are cross-sectional views of embodiments of the semiconductor device package of FIG. 1 along line A-A, each illustrating different arrangements of the bottom winding traces of the mold-embedded inductor, in accordance with various embodiments.
Figure 2B:
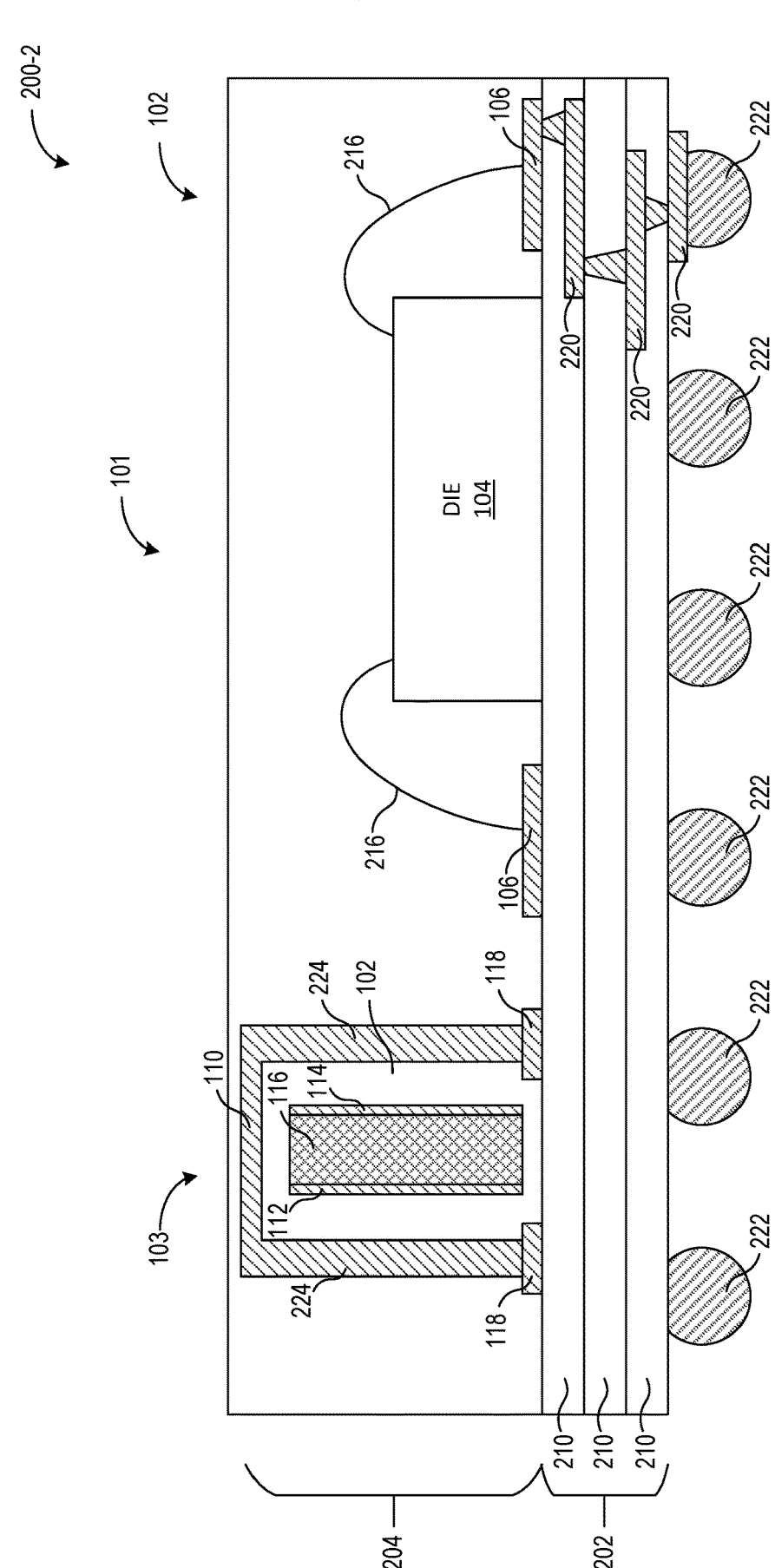
Figure 2C:
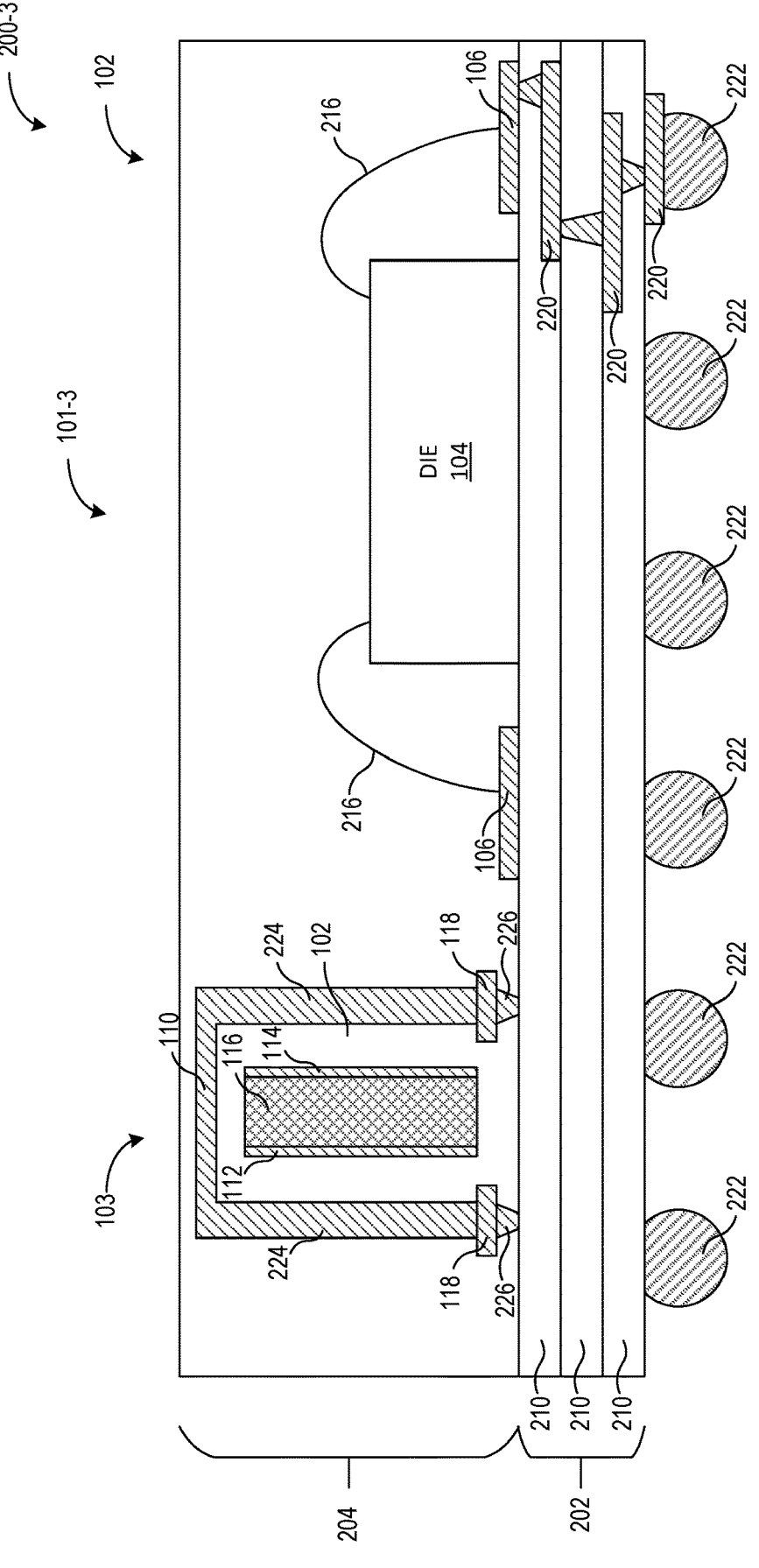

FIG. 1 shows a partially transparent top-down view 100 of a semiconductor device package 101 (sometimes referred to as the "package 101") that includes a die 104 coupled (i.e., electrically coupled) to a mold-integrated inductor 103 (sometimes referred to herein as the "inductor 103"). FIGS. 2A-2C shows respective cross-sectional views 200-1, 200-2, 200-3 of embodiments of the semiconductor device package 101 along the line A-A shown in FIG. 1. FIGS. 3A-3C show respective partial cross-sectional views of embodiments of the semiconductor device package 101 along the line B-B shown in FIG. 1. The views 100, 200-1, 200-2, 200-3, 300-1, 300-2, 300-3 may be described with respect to a common reference coordinate system 130, where the view 100 corresponds to a z-axis perspective view and the views 200-1, 200-2, 200-3, 300-1, 300-2, 300-3 correspond to perspective views that are normal to the z-axis. The semiconductor device package 101 is further described with simultaneous reference to the views 100, 200-1, 200-2, 200-3, 300-1, 300-2, 300-3 of FIGS. 1, 2A-2C, and 3A-3C, where applicable. Embodiments of the semiconductor device package 101 corresponding to embodiments of FIGS. 2A and 3A may be denoted as package 101-1. Embodiments of the semiconductor device package 101 corresponding to embodiments of FIGS. 2B and 3B may be denoted as package 101-2. Embodiments of the semiconductor device package 101 corresponding to embodiments of FIGS. 2C and 3C may be denoted as package 101-3.

The semiconductor device package 101 may be a molded package, such as a quad flat no-lead (QFN) package, a flip chip—chip scale package (FC-CSP), a fan out—wafer level package (FO-WLP), or a fan-out panel level package (FO-PLP), as non-limiting examples. The semiconductor device package 101 may include a package substrate 202 and an active region 204. In one or more embodiments, the package substrate 202 may be a printed circuit board (PCB). The package substrate 202 may include a stack of multiple dielectric layers 210. While three dielectric layers 210 are shown in the present example, it should be understood that more or fewer dielectric layers may be included in the package substrate 202 according to various other embodiments. The package substrate 202 may also include multiple conductive structures embedded in or disposed on the dielectric layers 210, including conductive layers 220. As shown in FIGS. 2A and 3A, in one or more embodiments, the package substrate 202 of the package 101-1 may include conductive vias 212 and bottom winding traces 118 embedded in or disposed on the dielectric layers 210. It should be understood that, as used herein, the term "conductive" refers to electrical conductivity. In one or more embodiments, solder balls 222 may be disposed on a bottom surface of the package substrate 202.

In one or more embodiments, an inductor 103 and a die 104 may be disposed in the active region 204 at a top surface (opposite the bottom surface) of the package substrate 202. The die 104 may be a semiconductor device die, such as a PMIC die. The die 104 may be coupled to one or more conductive bond pads 106, 107 that are disposed on the top surface of the package substrate 202. For example, the die 104 may be coupled to the conductive bond pads 106 via respective wire-bonds 216. The die 104 may be coupled to one or more of the solder balls 222 via one or more of the wire-bonds 216, one or more of the conductive bond pads 106, and conductive layers 220 disposed in or on the package substrate 202 (and, in some embodiments, through conducive vias disposed between the conductive layers 220). While wire-bonds 216 are shown to connect the die 104 to the package substrate 202 via the conductive bond pads 106, 107 in the present example, it should be noted that such an arrangement is intended to be illustrative and not limiting. In one or more other embodiments, other applicable approaches to coupling the die 104 to the package substrate 202, such as flip chip bonding, may be performed.

The inductor 103 and the die 104 may each be completely or partially embedded in the mold material 102 of the package 101. For example, the inductor 103 may include an inductor core 116 that is disposed on or over the top surface of the package substrate 202 and that is embedded in the mold material 102. As shown in the view 100, the inductor core 116 may be aligned along the y-dimension, with respect to the reference coordinate system 130, such that the long axis (i.e., the longest axis of symmetry) of the inductor core 116 is aligned parallel with respect to the top surface of the package substrate 202 and substantially extends in the positive y-direction.

Conductive sidewalls 112 and 114 of the inductor 103 may be disposed on opposite sides of the inductor core 116 and may directly contact the inductor core 116. The inductor core 116 may be formed from magnetic material, such as CoNiFe or another suitable magnetic material. The conductive sidewalls 112 and 114 may be formed from conductive material, such as copper. The inductor 103 may further include an inductor winding 105 that includes multiple conductive winding traces, such as lateral winding traces 224, topside winding traces 110, and bottom winding traces 118. The lateral winding traces 224 and the topside winding traces 110 may be embedded in the mold material 102 and may be separated from the inductor core 116 and the conductive sidewalls 112 and 114 by portions of the mold material 102. In one or more embodiments, the topside winding traces 110 may be partially embedded, rather than completely embedded, in the mold material 102 (e.g., such that one or more surfaces of the topside winding traces 110 are not covered by the mold material 102).

As shown in FIGS. 2A and 3A, in one or more embodiments, the bottom winding traces 118 may be embedded in one of the dielectric layers 210 of the package substrate 202. In one or more such embodiments, the lateral winding traces 224 may be coupled to the bottom winding traces 118 by conductive vias 212 extending at least partially through one or more of the dielectric layers 210 of the package substrate 202.

As shown in FIGS. 2B and 3B, in one or more alternative embodiments, the bottom winding traces 118 may instead be formed directly on a top surface of the package substrate 202, rather than being embedded in the package substrate 202. In one or more such embodiments, the lateral winding traces 224 may directly contact the bottom winding traces 118 through the mold material 102, such that the cavities in which the lateral winding traces 224 are formed do not extend completely through the mold material 102 to the upper surface of the package substrate 202.

As shown in FIGS. 2C and 3C, in one or more alternative embodiments, the bottom winding traces 118 may instead be formed embedded in the mold material 102 without directly contacting the package substrate 202, rather than being embedded in the package substrate 202. In one or more such embodiments, the lateral winding traces 224 may directly contact the bottom winding traces 118 through the mold material 102, such that the cavities in which the lateral winding traces 224 are formed do not extend completely through the mold material 102 to the upper surface of the package substrate 202. In one or more such embodiments, one or more conductive vias 226 disposed in the mold material 102 may couple the bottom winding traces 118 to the package substrate 202 (or conductive structures disposed in or on the package substrate 202). For example, one or more of the conductive vias 226 may couple the bottom winding traces to one or more conductive structures formed in or on the package substrate 202, where such conductive structures may electrically couple the conductive vias to the die 104 (e.g., by providing an electrical connection to the bond pad 107 that is coupled to the die 104).

The lateral winding traces 224, the topside winding traces 110, and the bottom winding traces 118 may, together, form inductor windings of the inductor 103, which wrap (e.g., wind in a substantially helical or spiral arrangement) around the inductor core 116. The lateral winding traces 224, the topside winding traces 110, the bottom winding traces 118, and the conductive vias 212 may be formed from one or more respective conductive materials, such as copper. In one or more embodiments, the lateral winding traces 224 and the topside winding traces 110 may be formed from the same conductive material (e.g., via active mold packaging (AMP) and associated laser direct structuring (LDS) processes, as will be described). A proximal end of the inductor winding 105 of the inductor 103 may be coupled, via a conductive trace 108, to a bond pad 107 that is coupled to the die 104. A distal end of the inductor winding 105 of the inductor 103 may be coupled to one or more of the solder balls 222 or to one or more other devices disposed in the active region 204, according to various embodiments. The conductive trace 108 may be embedded in one of the dielectric layers 210 of the package substrate 202 or may be formed on the top surface of the package substrate 202, according to various embodiments.

As will be described, in one or more embodiments the inductor core 116, the conductive side walls 112 and 114, the lateral winding traces 224 and the topside winding traces 110 of the inductor 103 may be formed (e.g., embedded) in the mold material 102 using AMP and associated LDS processes. The AMP process may generally involve steps of forming mold material, such as the mold material 102, over a package substrate, such as the package substrate 202, (and any elements already disposed on the package substrate, such as the die 104), then performing an LDS process to activate surfaces of the mold material while simultaneously forming openings (sometimes referred to as "through-mold vias" or "TMVs") in the mold material, then plating (e.g., via an electroless plating process) the activated surfaces with material such as copper. In such embodiments, the mold material 102 may be an epoxy mold compound, which may include a thermoset (e.g., thermoplastic) polymer. The mold material 102 may be doped with a laser-activatable additive.

In one or more embodiments, the activatable additive in the mold material 102 may include a spinel-type metal oxide, a metal oxide having two or more transition elements in adjacent groups of the periodic table, and/or a tin-containing oxide. Herein, two "adjacent groups" of elements refers to a pair of groups comprising group "n" and group "n+1". According to various embodiments, "n" may be a value from 3 to 12, such that the adjacent group of elements may be selected from groups 3 to 13 of the periodic table. Examples of the transition elements of the adjacent groups may include, where applicable, any of scandium, yttrium, titanium, zirconium, vanadium, niobium, chromium, molybdenum, manganese iron, ruthenium, cobalt, rhodium, iridium, nickel, palladium, platinum, copper, silver, gold, zinc, cadmium, aluminum, gallium, indium, or the like.

Additionally or alternatively, the laser-activatable additive in the mold material 102 may include a metal composite oxide including iron, manganese, nickel, copper, cobalt, tin, titanium, chromium, or a combination thereof and a copper salt such as copper chromite, cuprous thiocyanate, copper sulfate, copper phosphate, copper hydroxide phosphate, or another suitable copper salt.

The mold material 102 may formed over the package substrate 202 via injection molding, compression molding, transfer molding, sheet molding, or another applicable molding process, in accordance with various embodiments. During the LDS process, a laser may be applied to surfaces of the mold material 102, which may create openings in the mold material 102 while simultaneously activating the surfaces via a physical-chemical reaction caused, at least in part, by the high temperature (e.g., around 1000° C.) of the laser. Activation of the surfaces of the mold material 102 by the laser may convert additive(s) in the mold material 102 into bulk conductive material (e.g., bulk copper or another suitable bulk conductive material), which may act as a seed for subsequent electroless plating (e.g., of copper or another suitable conductive material). Application of the laser in the LDS process may additionally restructure the activated surfaces into micro-rough surfaces, which may further aid in the adhesion of metal that may be subsequently formed on the activated surfaces via electroless plating. The formation of a conductive seed layer in an activated surface of the mold material 102 concurrently with forming cavities in the mold material 102 via laser ablation, in accordance with one or more embodiments described herein, may allow for the formation and plating of cavities with higher aspect ratios, compared to the aspect ratios of cavities that can be successfully formed and plated using conventional techniques (e.g., using sputtering to form a conductive seed layer). By using the AMP and LDS processes to form micro-rough conductive seed layers at activated surfaces of the mold material 102, improved metal adhesion may be achieved during subsequent electroless plating of conductive material.

While various embodiments described herein relate to the formation of a mold-embedded inductor (e.g., the inductor 103) using AMP and LDS processes, it should be understood that these examples are intended to be illustrative and not limiting. For example, in accordance with various other embodiments, sputtering, chemical vapor deposition, or other applicable processes, may alternatively be used to form seed layers for subsequent electroless or electrolytic plating of conductive elements of the mold-embedded inductor 103. For example, in accordance one or more other embodiments, reactive ion etching, wet chemical etching, or other applicable processes, may alternatively be used to form cavities in the mold material 102 when forming the mold-embedded inductor 103.

By embedding the inductor 103 in the mold material 102, aspects of the package 101 may be improved compared to conventional approaches in which, instead of the inductor 103, a discrete (e.g., surface mount) inductor is disposed on the surface of the package substrate or embedded in the dielectric layers of the package substrate. For example, the volume of the package 101 may be comparatively reduced (e.g., since the space occupied by the inductor would otherwise have been occupied by mold material). For example, the inductor 103 may be placed in comparatively closer proximity to the die 104 (e.g., which may improve performance of the circuit that includes the die 104 and the inductor 103).

FIG. 4 is a process flow diagram depicting a method 400 for fabricating a semiconductor device package, such as the semiconductor device package 101-1 of FIGS. 1, 2A, and 3A, in accordance with various embodiments. For enhanced understanding, FIG. 4 may be viewed simultaneously with FIGS. 5-16, which are cross-sectional views depicting the semiconductor device package 101-1 (i.e., corresponding to embodiments of FIGS. 2A and 3A) from a perspective along the line A-A of FIG. 1 at various stages of fabrication, in accordance with various embodiments.

Figure 5:
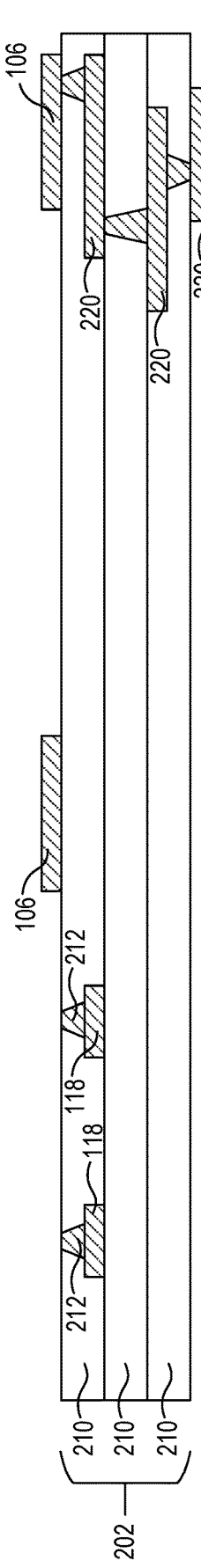

Referring first to step 402 of FIG. 4 and to FIG. 5, at a stage of fabrication 500, the package substrate 202 is provided, which may include bond pads 106 disposed on a topside of the package substrate 202 and may include conductive layers 220, bottom winding traces 118, and conductive vias 212 disposed in dielectric layers 210. It should be understood that the package substrate 202 may include additional elements (e.g., backside metallization, additional conductive layers embedded in the dielectric layers 210, and/or the like) not illustrated here. The package substrate 202 may be a PCB. According to various embodiments, the package substrate 202 may be configured and/or dimensioned for use in any of a QFN package, a FC-CSP, a FO-WLP, or a FO-PLP, as non-limiting examples.

The bottom winding traces 118 may be disposed in a top-most layer of the dielectric layers 210 (e.g., for better proximity to the inductor 103, once the inductor 103 has been formed). The conductive vias 212 may extend partially through the top-most layer of the dielectric layers 210 to contact the bottom winding traces 118. The conductive layers 220 may be electrically coupled to one another using conductive vias interposed between adjacent conductive layers of the conductive layers 220. The conductive layer 220 disposed at the bottom side of the package substrate 202 may be electrically connected to one of the bond pads 106 disposed at the topside of the package substrate 202 through the conductive vias and the other conductive layers 220.

Referring next to step 404 of FIG. 4 and to FIG. 6, during a stage of fabrication 600, the die 104 is bonded to the package substrate 202. For example, the die 104 may be bonded to the package substrate 202 using non-conductive adhesive material (e.g., epoxy, die attach film, or the like), conductive adhesive material (e.g., solder paste), solder balls, or another suitable bonding material. Wire bonds 216 may include gold or another suitable electrically conductive material. The wire bonds 216 may be bonded to the bond pads 106, 107 and to the die 104 to electrically couple the bond pads 106, 107 to the die 104. As described previously, the die 104 may be an integrated circuit die, such as a PMIC die.

Referring next to step 406 of FIG. 4 and to FIG. 7, during a stage of fabrication 700, first mold material 702 may be formed over the package substrate 202, die 104, and wire bonds 216. The first mold material 702 may be an epoxy mold compound, which may include a thermoset (e.g., thermoplastic) polymer. The first mold material 702 may be doped with a laser-activatable additive. In one or more embodiments, the laser-activatable additive in the mold material may include a metal composite oxide including iron, manganese, nickel, copper, cobalt, tin, titanium, chromium, or a combination thereof and a copper salt such as copper chromite, cuprous thiocyanate, copper sulfate, copper phosphate, copper hydroxide phosphate, or another suitable copper salt. According to various embodiments, the first mold material 702 may be formed over the package substrate 202 via injection molding, compression molding, transfer molding, sheet molding, or another applicable molding process. The mold material 102 of FIGS. 1-3 may include the first mold material 702, for example.

Referring next to step 408 of FIG. 4 and to FIG. 8, during a stage of fabrication 800, winding cavities 802 and a core cavity 804 may be formed in the first mold material 702. In one or more embodiments, the winding cavities 802 and a core cavity 804 are formed in the first mold material 702 via laser ablation in an LDS process. For example, one or more beams of laser energy may be applied to the first mold material 702, heating portions of the first mold material 702 (e.g., to around 1000° C. or more) to create the winding cavities 802 and a core cavity 804. In one or more embodiments, the core cavity 804 may extend entirely through the first mold material 702, such that a portion of the upper surface of the package substrate 202 is exposed through the core cavity 804. In one or more other embodiments, the core cavity 804 may alternatively extend only partially into the first mold material 702, such that the first mold material 702 separates the core cavity 804 from the package substrate 202 and such that the core cavity 804 does not expose any portion of the package substrate 202.

Application of laser energy during the LDS process, in addition to forming cavities in the mold material 702 via laser ablation, may activate surfaces of the first mold material 702. Activation of surfaces of the first mold material 702 by the laser energy may cause a physical-chemical reaction that converts the laser-activatable additive in the first mold material 702 to bulk conductive material (e.g., bulk copper), which acts as a seed for subsequent electroless plating of the activated surfaces of the first mold material 702. Application of laser energy during the LDS process may additionally restructure the activated surfaces into micro-rough surfaces, where the micro-rough activated surfaces may have improved metal adhesion to subsequent electroless plating.

Figure 9:
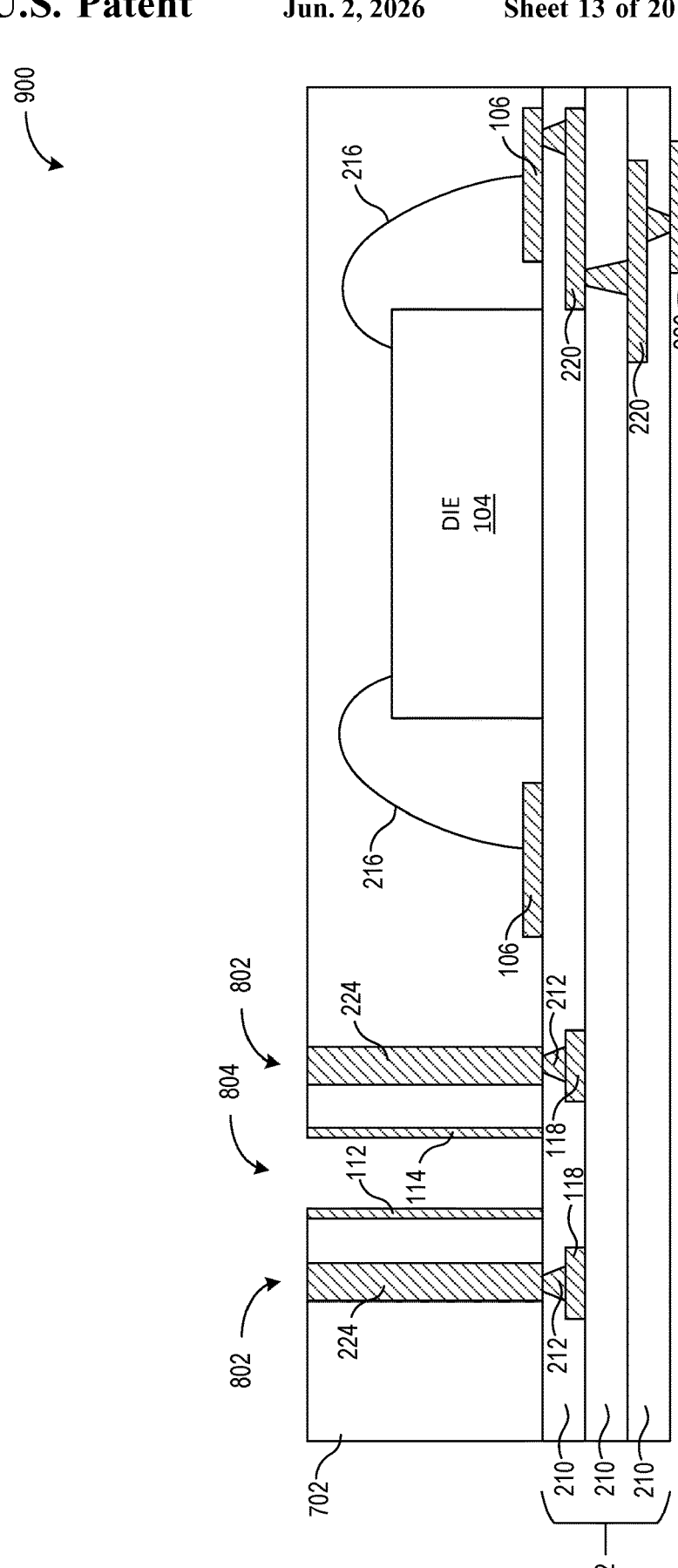

Referring next to step 410 of FIG. 4 and to FIG. 9, during a stage of fabrication 900, the lateral winding traces 224 and conductive sidewalls 112, 114 may be formed in the winding cavities 802 and the core cavity 804, respectively. In one or more embodiments, the lateral winding traces 224 and the conductive sidewalls 112, 114 may be formed via electroless plating of conductive material (e.g., copper) in the winding cavities 802 and the core cavity 804. Surfaces defining the winding cavities 802 and the core cavity 804 (i.e., the surfaces on which the lateral winding traces 224 and conductive sidewalls 112, 114 are formed) may be those surfaces of the first mold material 702 that were previously activated via the LDS process performed at step 408 and the stage of fabrication 800. As discussed previously, these activated surfaces may include bulk conductive material (e.g., bulk copper) and may be micro-rough surfaces. The lateral winding traces 224 may be electrically connected to the bottom winding traces 118 by the conductive vias 212.

Figure 10:
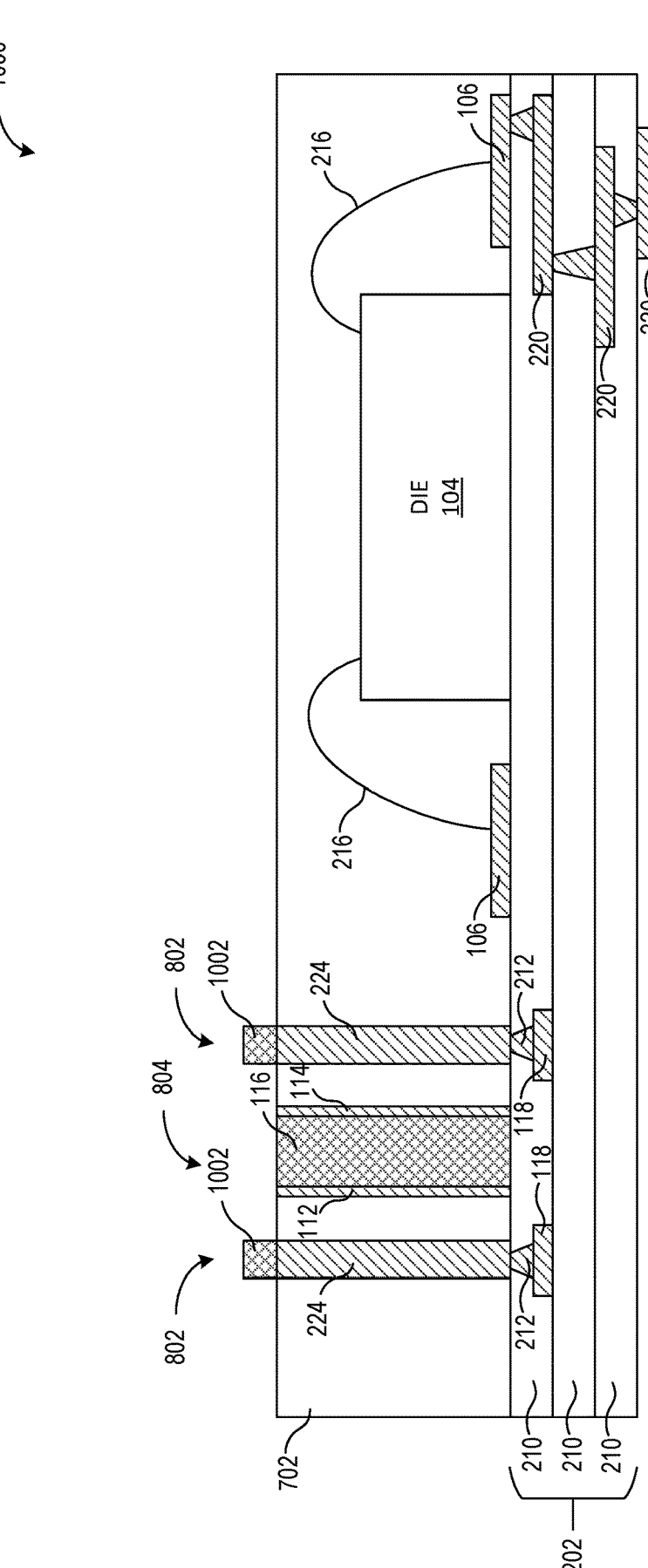

Referring next to step 412 of FIG. 4 and to FIG. 10, during a stage of fabrication 1000, the inductor core 116 may be formed in the core cavity 804. For example, the inductor core 116 may include CoNiFe or another suitable magnetic material. In some embodiments, the magnetic material used to form the inductor core 116 may be formed on the conductive sidewalls 112, 114 within the core cavity 804 via electroless or electrolytic plating, according to various embodiments. In some embodiments, formation of the inductor core 116 may result in the formation of excess magnetic material 1002 over the package substrate 202 (e.g., on top surfaces of the lateral winding traces 224, as shown in the present example).

In one or more other embodiments, the first mold material 702 may be a compound mold material that includes additives which, when laser-activated during the LDS process, are converted to both bulk conductive material (e.g., copper) and bulk magnetic material (e.g., CoNiFe). In such embodiments, the core cavity 804 may be formed separately from the winding cavities 802 after formation of the lateral winding traces 224, such that formation of the conductive sidewalls 112, 114 are omitted, and the magnetic material of the inductor core 116 may be formed directly on the activated surfaces of the first mold material 702 that define sidewalls of the core cavity 804.

Figure 11:
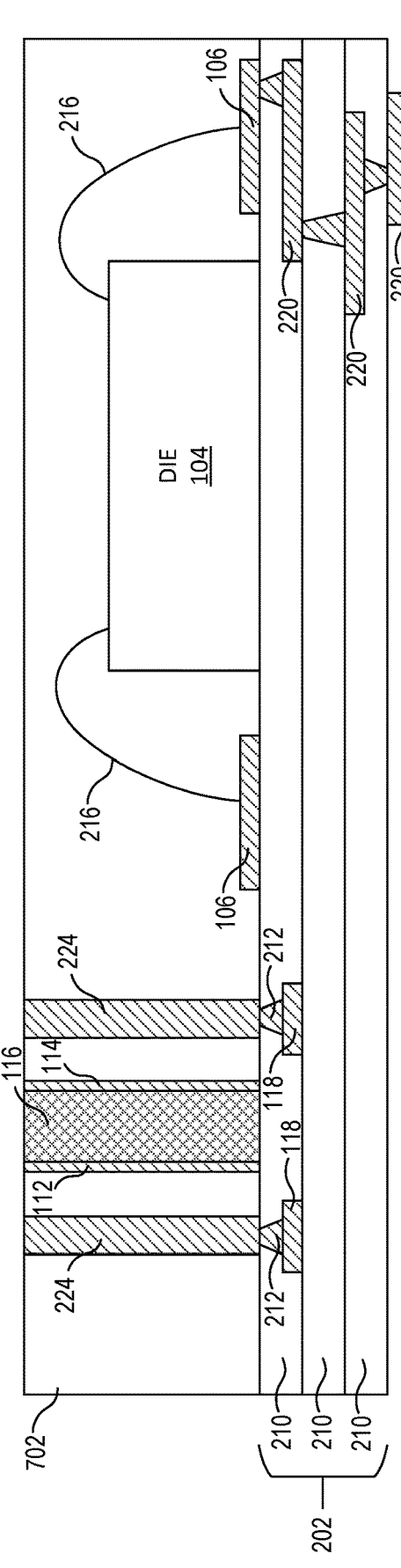

Referring next to step 414 of FIG. 4 and to FIG. 11, during a stage of fabrication 1100, excess magnetic material 1002 may be removed. In one or more embodiments, the excess magnetic material 1002 may be removed via grinding. For example, the package substrate 202 may be mounted to a grinding chuck and a grinder apparatus may be used to remove (e.g., grind down) the excess magnetic material 1002 to create a substantially planar surface that includes top surfaces of the lateral winding traces 224 and the first mold material 702. In one or more other embodiments, the excess magnetic material 1002 may be removed via any of chemical wet etching, reactive ion etching, or another suitable etch process.

Referring next to step 416 of FIG. 4 and to FIG. 12, during a stage of fabrication 1200, a layer 1202 may be formed over the first mold material 702. In one or more embodiments, the layer 1202 may be a second mold material (e.g., having the same or a substantially similar composition as the first mold material 702, including the laser-activatable additive) that is suitable for use in conjunction with AMP/LDS processes. In one or more such embodiments, the second mold material of the layer 1202 may be formed over the first mold material 702 via injection molding, compression molding, transfer molding, sheet molding, or another applicable molding process. In one or more embodiments, the second mold material of the layer 1202 may be included in the mold material 102 of FIG. 1.

In one or more other embodiments, the layer 1202 may instead be a layer of dielectric material formed over the first mold material 702. For example, in one or more such embodiments the dielectric material may include one or more of epoxy resin, polyimide, polybenzoxazole (PBO), or the like. In one or more such embodiments, the dielectric material may be deposited over the first mold material 702 using a deposition process such as evaporation, sputtering, plasma deposition, chemical vapor deposition (CVD), low-pressure chemical vapor deposition (LPCVD), stencil printing, or lamination (e.g., if the dielectric material is a preformed sheet, such as a sheet of Ajinomoto build-up film (ABF)).

Figure 13:
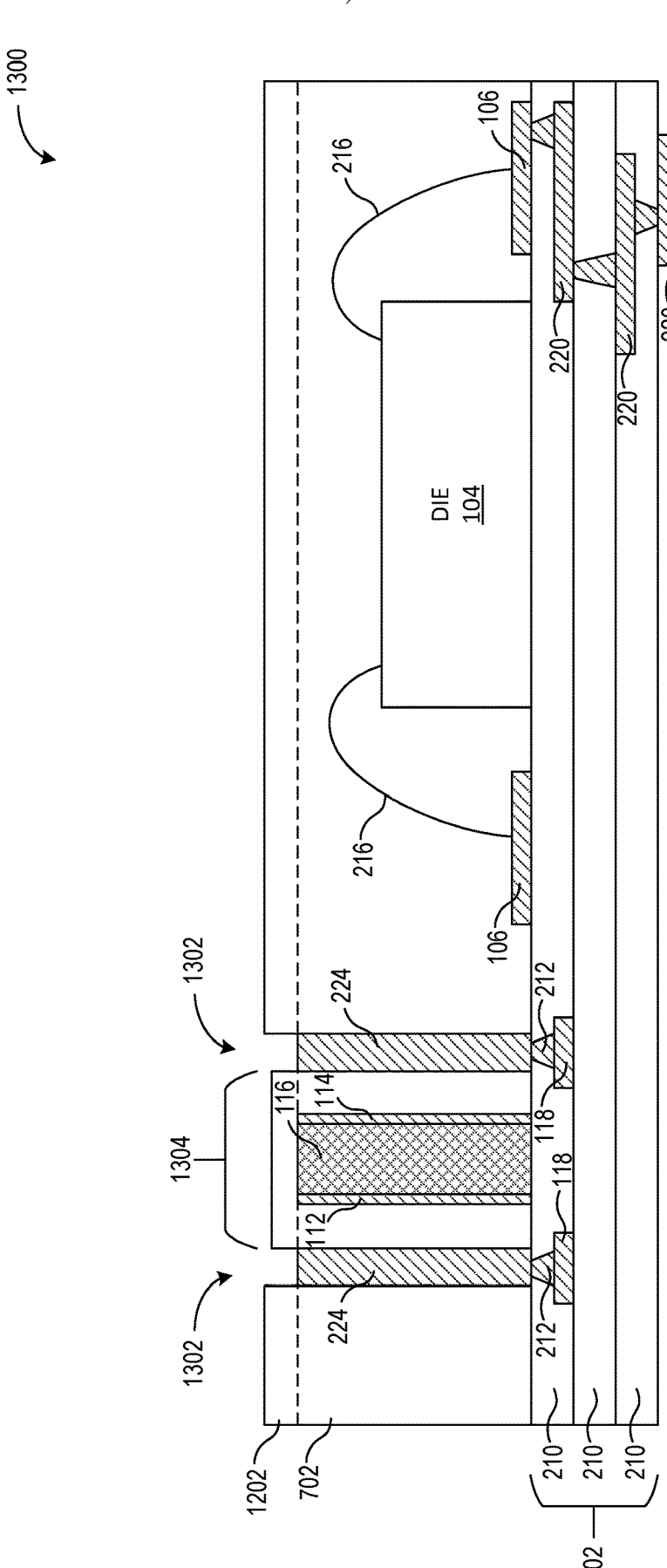

Referring next to step 418 of FIG. 4 and to FIG. 13, during a stage of fabrication 1300, cavities 1302 may be formed in the second mold material 1202 over the lateral winding traces 224 and portions of the layer 1202 in a region 1304 may be removed (e.g., to accommodate subsequent formation of the topside winding traces 110 over the region 1304).

In one or more embodiments in which the layer 1202 is a layer of second mold material, formation of the cavities 1302 and removal of portions of the layer 1202 in the region 1304 may be performed via laser ablation as part of an AMP/LDS process. As described above, application of laser energy to the second mold material of the layer 1202 may activate surfaces of the second mold material of the layer 1202 (e.g., corresponding to surfaces of the layer 1202 that form sidewalls of the cavities 1302 and that form the top surface of the layer 1202 in the region 1304). Activation of these surfaces of the layer 1202 may include texturing (e.g., micro-roughing) these surfaces and forming bulk conductive material (e.g., copper) from additives in the second mold material via physical-chemical reaction induced by heat from the laser energy. Activating these surfaces of the layer 1202 in this way may enable and/or improve subsequent formation of conductive material on the activated surfaces of the layer 1202 via electroless plating.

In one or more other embodiments in which the layer 1202 is a layer of dielectric material, the formation of the cavities 1302 may be performed via etching (e.g., RIE or wet chemical etching) or laser ablation of corresponding portions of the dielectric material of the layer 1202. In one or more such embodiments, the removal of portions of the layer 1202 in the region 1304 may be omitted.

Figure 14:
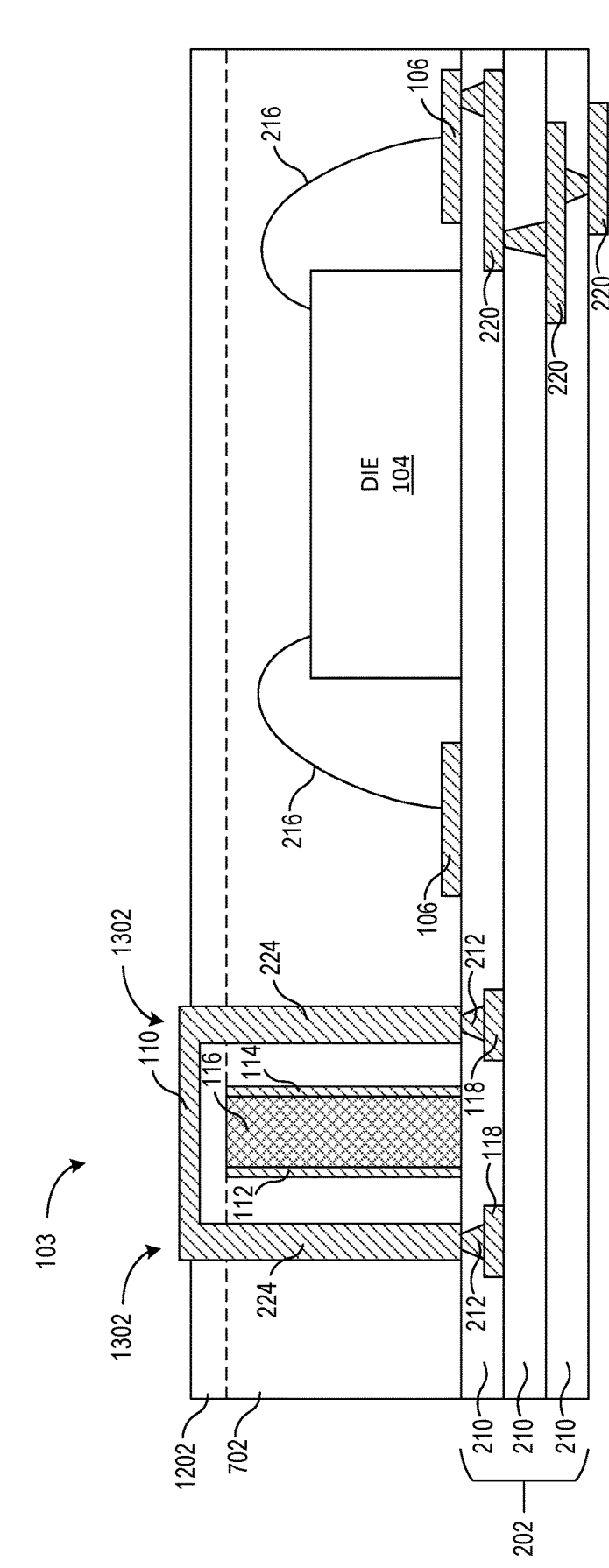

Referring next to step 420 of FIG. 4 and to FIG. 14, during a stage of fabrication 1400, topside winding traces 110 may be formed over the lateral winding traces 224 in the cavities 1302 and over the inductor core 116, such that the topside winding traces connect corresponding pairs of the lateral winding traces 224 to one another. In one or more embodiments, the topside winding traces 110 may be formed via electroless plating of copper or another suitable conductive material. For embodiments in which the layer 1202 includes second mold material, the type of conductive material from which the topside winding traces 110 are formed may be the same as that of the bulk conductive material formed via laser ablation of the layer 1202 at step 418.

In one or more embodiments in which the layer 1202 is formed from dielectric material, the topside winding traces 110 may be formed by sputtering a conductive seed layer over the layer 1202, applying patterned photoresist over the conductive seed layer, forming metal in regions not covered by the patterned photoresist via electroless plating, stripping the photoresist, and selectively etching the unplanted portions of the conductive seed layer. In one or more other embodiments in which the layer 1202 is formed from dielectric material, the topside winding traces 110 may be formed via printing of conductive ink over the portions of the layer 1202 in the region 1304 and over (and in contact with) the lateral winding traces 244.

Referring next to step 422 of FIG. 4 and to FIG. 15, during a stage of fabrication 1500, third mold material 1502 may be formed over the layer 1202 and the topside winding traces 110. In one or more embodiments, the third mold material 1502 may be included in the mold material 102 of FIG. 1.

In one or more other embodiments, the stage of fabrication 1500 may be omitted, and the topside winding traces 110 may remain exposed rather than being covered by the third mold material 1502. In one or more embodiments, the third mold material 1502 may be formed from the same material as that of the first mold material 702 and the layer 1202. In one or more other embodiments, the third mold material 1502 may be formed from a material (e.g., a thermoset epoxy without an LDS additive that is different from that of the first mold material 702 and the layer 1202 or may be formed from another dielectric material such as epoxy resin, polyimide, PBO, or the like.

Figure 16:
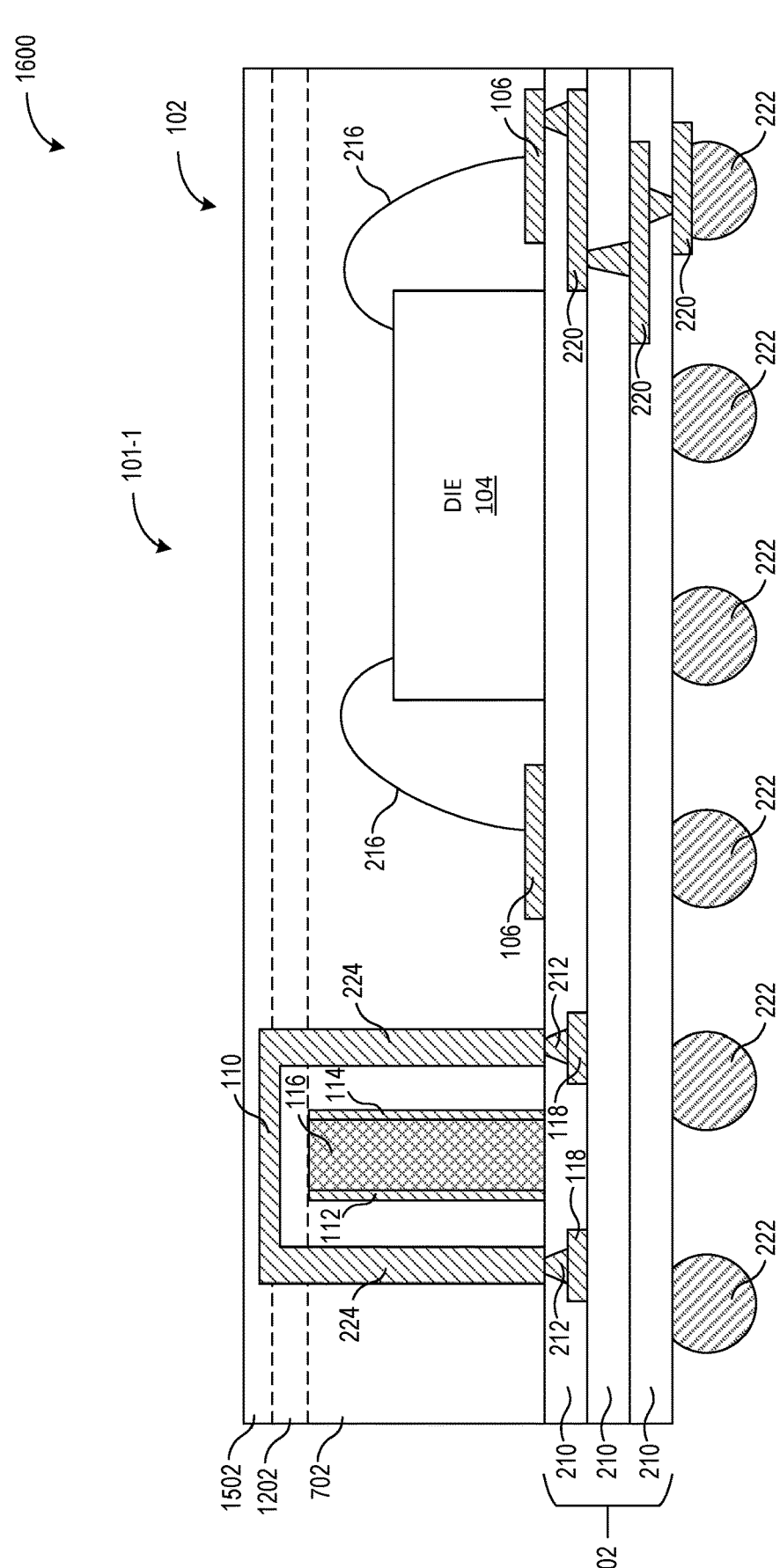

Referring next to step 424 of FIG. 4 and to FIG. 16, during a stage of fabrication 1600, solder balls 222 may be attached to the backside of the package substrate 202. At least one of the solder balls 222 may be coupled to one of the conductive layers 220, which may electrically connect the solder ball(s) to the die 104 in combination with the bond pad 106 and the wire bond 216. In one or more embodiments, the semiconductor device package 101-1 may subsequently be bonded (e.g., by reflowing the solder balls 222) to another substrate, such as that of an interposer or a PCB.

While the examples of FIGS. 4-16 are described with reference to embodiments of the package 101-1 of FIGS. 2A and 3A, it should be understood that similar methods and stages of fabrication may be used to form the lateral winding traces 224 and topside winding traces 110 of embodiments of the package 101-2 of FIG. 2B or the package 101-3 3B and FIGS. 2C and 3C.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of forming a semiconductor device package, the method comprising:

providing a package substrate;

forming first mold material over the package substrate; and forming an inductor having an inductor core that is embedded in the first mold material and having an inductor winding that is at least partially embedded in the first mold material, wherein the inductor core and at least a portion of the inductor winding are formed after forming the first mold material;

forming winding cavities and a core cavity in the first mold material via laser ablation;

while forming the winding cavities and the core cavity in the first mold material, activating first surfaces of the first mold material to form bulk conductive material via the laser ablation, wherein the first mold material comprises at least one laser-activatable additive configured to form the bulk conductive material in response to the laser ablation;

forming winding traces in the winding cavities, the inductor winding comprising the winding traces, wherein the winding traces are laterally adjacent to the core cavity, forming conductive sidewalls in the core cavity, wherein forming the winding traces in the winding cavities and forming the conductive sidewalls in the core cavity are performed concurrently via electroless plating of the first surfaces of the first mold material activated via the laser ablation;

forming the inductor core in the core cavity by forming magnetic material on the conductive sidewalls via electroless plating;

forming second mold material over the first mold material, the winding traces, and the inductor core; and performing additional laser ablation of the second mold material to:

form cavities in the second mold material that expose the winding traces; and form bulk conductive material in second surfaces of the second mold material via activation of at least one additional laser-activatable additive in the second mold material.

2. The method of claim 1, further comprising:

forming topside winding traces via electroless plating of conductive material on the second surfaces of the second mold material, wherein the inductor winding includes the topside winding traces, and wherein the topside winding traces are formed at least partially in the cavities in the second mold material and at least partially overlapping the inductor core.

3. The method of claim 2, further comprising:

forming third mold material over the second mold material and over the topside winding traces.

4. The method of claim 1, wherein the laser ablation of the first surfaces of the first mold material and the additional laser ablation of the second surfaces of the second mold material respectively cause the first surfaces and the second surfaces to be micro-rough surfaces.

5. The method of claim 1, further comprising:

attaching solder balls to a bottom surface of the package substrate, opposite a top surface of the package substrate at which the inductor is formed.

6. The method of claim 1, further comprising:

before forming the first mold material over the package substrate, bonding an integrated circuit die to the package substrate, wherein the integrated circuit die is electrically coupled to bottom winding traces of the inductor.

* * * * *